ULTRA HIGH GAIN TWO-TRANSISTOR REFLEX AMPLIFIER
Filed Dec. 16, 1964
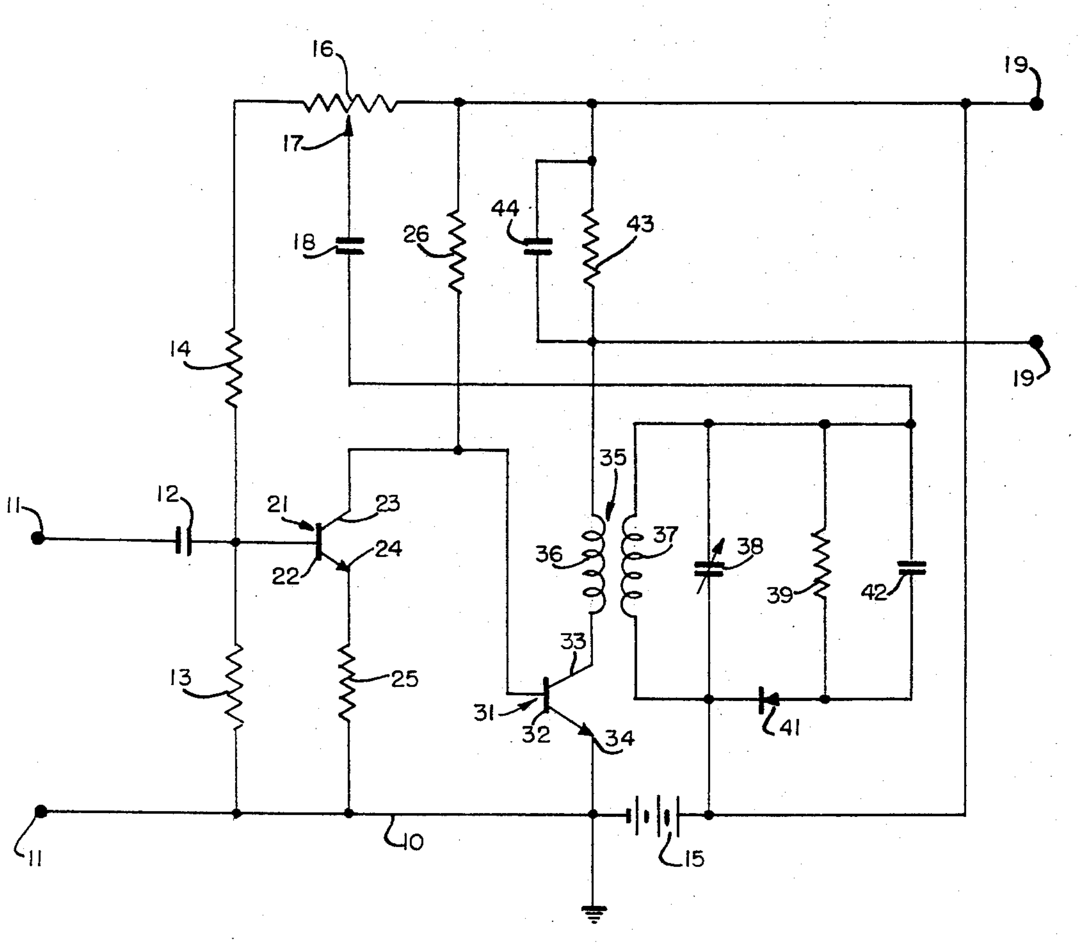
INVENTOR
Lloyd R. Crump
BY Harry M. Saragovitz, Edward J. Kelly, Herbert Berl & J. D. Edgerton
ATTORNEYS United States Patent Office 3,398,370
Patented Aug. 20, 1968

3,398,370
ULTRA HIGH GAIN TWO-TRANSISTOR REFLEX AMPLIFIER

Lloyd R. Crump, Silver Spring, Md., assignor to the United States of America as represented by the Secretary of the Army Filed Dec. 16, 1964, Ser. No. 418,929
2 Claims. (Cl. 325—486)

ABSTRACT OF THE DISCLOSURE

A solid state reflex amplifier providing high gain and low power supply drain and which responds to modulated and unmodulated signals to produce a response. The input goes to a two stage direct-coupled transistor amplifier with a diode detector at the amplifier output. The amplifier is biased by a voltage divider circuit connected across a D.C. power supply. The diode detector circuit integrates the output of the amplifiers and feeds the integrated signal back to the input of the amplifier for further amplification.

The invention described herein may be manufactured and used by or for the Government for governmental purposes without the payment to me of any royalty thereon.

This invention relates to amplifiers, and more particularly, to solid state reflex amplifiers which provide high gain and low power supply drain.

The rapid increase of automatic control of mechanical and electrical equipment has led to a greater need for reliable, small and long-lived control circuits. In addition, the present rapid development of space flight and the increasing need for additional electronic equipment on these space flights adds to the list of requirements for reliable control equipment, those of high gain and low power supply requirements.

Automatic control is becoming more and more to mean remote control. The distances from which control of equipment is being manifested are becoming greater and greater. For this reason, the device which receives the control signals which presage the initiation of the next sequence of operations must be sensitive. This means that it must be tunable and must have a high gain, so that a received signal which is attentuated from having been transmitted over long distances can be amplified into a signal capable of accomplishing its purpose. In those installations where the time periods over which control is to extend are long and where power supplies are limited by space, weight or other requirements, the control circuits must also be constructed so as not unduly to drain the available power. The present invention is a small, reliable, two-stage amplifier which fulfills the above requirements.

It is an object of this invention to provide a new and improved electronic circuit.

It is another object of this invention to provide a new and improved amplifier with high gain and low power drain.

It is a further object of this invention to provide a new and improved amplifier which responds to modulated and to unmodulated signals to produce a definite and unmistakable response.

Other objects and advantages of this invention will become apparent as the following description proceeds which description should be considered together with the accompanying drawings in which the single figure depicts the circuit of the amplifier of this invention in schematic form.

Referring now to the drawing in detail, the reference character 11 designates a pair of input terminals, one of which is connected to a common ground line 10, and the other, through a coupling capacitor 12, is connected to the base electrode 22 of a transistor 21. The transistor 21 further comprises a collector electrode 23 and an emitter electrode 24. The emitter electrode 24 is connected through a resistor 25 to the ground line 10, and the collector electrode 23 is connected through a load resistor 26 to the positive side of a source of direct current such as battery 15, the negative side of which is connected to the common ground line 10. A voltage divider comprising a potentiometer 16 having a slide contact 17, a resistor 14 and a resistor 13 is connected across the battery 15 to provide a bias voltage for the base electrode 22 which is connected to the junction of the resistors 13 and 14. The base electrode 32 of a power transistor 31 is connected to the collector electrode 23 across the load resistor 26. The transistor 31 further comprises a collector electrode 33 and an emitter electrode 34. The emitter electrode 34 is directly connected to the ground line 10. The collector electrode 33 is connected through the primary winding 36 of a transformer 35 and through a resistor 43 across which is connected a capacitor 44 to the positive side of the battery 15. The secondary 37 of the transformer 35 drives a detector circuit which comprises a capacitor 38 connected across the secondary 37, a diode 41, and a parallel arrangement of a capacitor 42 and a resistor 39. The diode 41 serves to connect one side of the parallel connected resistor 39 and capacitor 42 to one side of the parallel connected secondary 37 and capacitor 38. The junction of the resistor 39 and the diode 41 is coupled through a capacitor 18 to the slide contact 17 of the potentiometer 16.

In operation, the transistor 21 is biased to a conductive state during the time when there is no signal input. This is readily accomplished by so adjusting the relative values of the voltage divider connected across the battery 15 that the voltage drop across the resistor 13 places the base electrode 22 at a potential with respect to the emitter electrode 24 such that there is conduction through the circuit of the emitter 24-collector 23 circuit with no input signal present. At the same time, the current flow through the emitter 24-collector 23 circuit draws sufficient current through the load resistor 26 from the battery 15 to place a negative bias on the base electrode 32 of the power transistor 31 sufficient to maintain that transistor cut off when there is no input signal present. When an alternating signal or a substantially constant negative potential, is applied to the input terminals 11, the negative potential portions of the input signal oppose the positive bias applied to the base electrode 22, and the conduction through the transistor 21 decreases. This also reduces the current flowing through the load resistor 26 and decreases the bias applied to the base electrode 32. Current flow through the emitter 34-collector 33 circuit of the transistor 31 increases. The increase in the current flowing through the transistor 31 induces a potential in the secondary 37 of the transformer 35. Any variations in the amplitude of the input signal result in similar variation in the potential induced in the secondary 37. The diode 41 rectifies these potential variations, and they are integrated by the parallel arrangement of the capacitor 42 and the resistor 39. The capacitor 42 charges to a potential which varies as the amplitude of any modulating signal which appears at the terminals 11, and the potential developed across the capacitor 42-resistor 39 combination is applied through the coupling capacitor 18 to the slide contact 17 of the potentiometer 16. The voltage variations across the portion of the potentiometer between the slide contact 17 and the battery 15 changes the voltage across the series resistors 13 and 14 which comprise the rest of the potential divider. Voltage variations across resistor 13 are applied across the base electrode 22 and the emitter electrode 24 of the transistor 21, and they are then amplified by the transistor stages 21 and 31. The output voltage appears across the resistor 43 and capacitor 44. The time constant of the resistor 43 and capacitor 44 is selected to present to the output terminals 19 a signal which is of the general frequency of a modulating wave. If an unmodulated carrier is applied to the input terminals 11, then a substantially constant potential will appear across the terminals 19.

When a single direct current pulse or a negative potential is applied to the input terminals 11, the transistor 21 goes from its substantially full on, or saturation, condition to a condition of lesser conduction, depending upon the amplitude of the input potential. The decreased conduction through the load resistor 26 reduces the negative bias on the transistor 31 and permits that transistor to conduct. An amplified output of the single pulse appears across resistor 43. Output transistor 31 remains virtually biased-off until a pulse or a modulated signal is applied to the input terminals 11. When a CW (continuous wave) signal is applied to input terminals 11 and is modulated by a single pulse, the CW signal with the superimposed pulse is first amplified by transistor stages 21 and 31. The amplified signal output appears across the tuned transformer 35. The modulated wave created by the single pulse is induced in the secondary 37 of the transformer 35 and is detected by diode 41. The detected signal is then coupled back to transistor stages 21 and 31 for amplification as a single pulse, and the output pulse appears across resistor 43.

This amplifier serves as a reflex amplifier with very high gain and stability. It also serves, in effect, as a trigger circuit, since a comparatively small input signal will serve to change the conduction of transistor 31 from near-off to full-on. It is this latter characteristic of the circuit which renders it suitable for switching purposes and remote control use. In addition, the frequency response of the circuit is readily adjustable by the selection of the capacitors 12, 18, 44, 38 and 42. In addition, the circuit is generally self temperature compensating by its construction. Since a rise in temperature tends to cause transistor 21 to conduct more heavily, it also causes transistor 31 to be biased off, thus tending to compensate for the increased-conduction characteristic with-rising-temperature of transistor 31. The power drain on the battery 15 is kept to a minimum. Transistor 21 should be selected to have a very low current carrying capacity, even when it is fully conductive. Since transistor 21, when it is conducting, causes transistor 31 to be cut off, transistor 31, the power transistor, may be capable of conducting heavily for power gain. When no signal is present at the input terminals 11, only a small current flows in the circuit. But when a pulse or modulated signal is applied to terminals 11, the output at terminals 19 is a greatly amplified signal. Thus, a strong output signal is available when it is desired. A circuit which draws only a few hundred microamperes with no input signal was constructed with a gain of over $10^6$. The amplifier of this invention is versatile. It will produce an integrated or detected output signal from a modulating signal input, or it will produce an output pulse in response to a pulse input signal.

The above specification has described a new and improved amplifier which is versatile. The amplifier of this invention is useful for control purposes where the supply of power is limited. It will produce an output signal from a modulated input wave or a pulse output in response to a pulse input. It is realized that the above description may indicate to others in the art other ways in which the spirit of the invention may be used without departing from its principles. It is, therefore, intended that this invention be limited only by the scope of the appended claims.

What is claimed is:

1. A high gain amplifier for pulsed and modulated signals, said amplifier being temperature stable and comprising a first stage connected to a second stage, said first stage comprising an electronic amplifying element having an input electrode and a pair of output electrodes, means for applying a signal potential to the input of said first stage, a source of electrical energy, a first potential divider connected across said source to said input electrode for biasing said first stage to be conductive when no signals are applied thereto, a load impedance connected in series with said output electrodes so that the current passing through said output electrodes also passes through said load impedance wherein said load impedance and said output electrodes comprise a second potential divider connected across said source of electrical energy, said second stage comprising an electronic amplifying element having a pair of conductive electrodes and a control electrode, said control electrode being connected to the junction of said load impedance and said output electrodes of said first stage amplifier element so that the potential drop across said load impedance due to the flow of current through said second potential divider biases said control electrode to control the flow of current through said second stage, means connected to said first stage and to said second stage for biasing said second stage to a substantially non-conductive state when said first stage is conductive, a transformer having a primary winding and a secondary winding, an output impedance, means for connecting said primary winding and said output impedance in series with said pair of conductive electrodes across said source of electrical energy, a detector circuit coupled to the output from said second stage across said secondary winding to detect and integrate the signal output therefrom, said detector circuit comprising an integrating circuit which includes a parallel connected resistor and capacitor, and a diode detector connecting one side of said secondary winding with one side of said integrating circuit, the other side of said secondary winding being directly connected to the other side of said integrating circuit to provide an output therefrom, feedback means including a series connected D-C blocking capacitor connected between the output from said integrating circuit and said first potential divider to feed only the detected audio frequency output from said detector to said first stage, and means for connecting the other side of said integrating circuit to one side of said source of electrical energy so that the signal appearing across said integrating circuit is applied across a portion at least of said first potential divider whereby the detected audio frequency signal is reamplified by said first and second stages to provide an audio output signal across said output impedance.

2. The amplifier defined in claim 1, further including a tuning capacitor connected in parallel with said secondary windings, said tuning capacitor being adjustable to tune said transformer to a desirable carrier frequency.

References Cited

UNITED STATES PATENTS

| | | | |
|---|---|---|---|
| 3,054,955 | 9/1962 | Hsin Hsu Wei | 325—486 |
| 3,051,904 | 8/1962 | Waring | 325—486 |
| 3,258,695 | 6/1966 | Brown et al. | 325—486 |
| 3,299,358 | 1/1967 | Wood | 325—486 XR |

KATHLEEN H. CLAFFY, *Primary Examiner.*

R. LINN, *Assistant Examiner.*